(12) United States Patent
Nguyen et al.

(10) Patent No.: US 9,035,677 B2
(45) Date of Patent: May 19, 2015

(54) HIGH-SPEED LOW POWER STACKED TRANSCEIVER

(75) Inventors: Huy Nguyen, San Jose, CA (US);
Kambiz Kaviani, Palo Alto, CA (US);
Yohan Usthavvia Frans, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/130,756

(22) PCT Filed: Jun. 11, 2012

(86) PCT No.: PCT/US2012/041864
§ 371 (c)(1),
(2), (4) Date: Jan. 3, 2014

(87) PCT Pub. No.: WO2013/009418
PCT Pub. Date: Jan. 17, 2013

(65) Prior Publication Data
US 2014/0145760 A1 May 29, 2014

Related U.S. Application Data

(60) Provisional application No. 61/505,815, filed on Jul. 8, 2011.

(51) Int. Cl.
*H03K 19/0175* (2006.01)
*H04L 25/02* (2006.01)
*H04L 25/03* (2006.01)

(52) U.S. Cl.
CPC .... *H03K 19/017509* (2013.01); *H04L 25/0274* (2013.01); *H04L 25/0282* (2013.01); *H04L 25/0294* (2013.01); *H04L 25/03146* (2013.01); *H04L 25/03878* (2013.01)

(58) Field of Classification Search
USPC .................... 326/82, 83, 86, 87, 68
See application file for complete search history.

(56) References Cited

U.S. PATENT DOCUMENTS

| | | | |
|---|---|---|---|
| 5,578,944 A | 11/1996 | Sasaki | |
| 7,088,127 B2 | 8/2006 | Ngyuen et al. | |
| 7,764,090 B2 * | 7/2010 | Yamashita et al. | ............ 327/108 |
| 7,936,180 B2 | 5/2011 | Chao et al. | |

(Continued)

FOREIGN PATENT DOCUMENTS

WO   WO-2008-100494 A2   8/2008

OTHER PUBLICATIONS

Inti et al., "A Highly digital 0.5-to-4Gb/s 1.9mW/Gb/s Serial Link Transceiver Using Current-Recycling in 90nm CMOS," 2011, ISSCC 2011/Session8/Architectures & Circuits for Next Generation Wireline Transceivers/8.6, Digest of Technical Papers, IEEE International Solid-State Circuits Conference, pp. 152-153. 3 pages.

(Continued)

*Primary Examiner* — Daniel D Chang
(74) *Attorney, Agent, or Firm* — Silicon Edge Law Group LLP; Arthur J. Behiel

(57) ABSTRACT

A transceiver includes a transmitter and receiver that form a series current path between two power-supply nodes. Powering both the transmitter and receiver with the same supply current saves power. The transmitter functions as a resistive load for the receiver, and thus performs useful work with power that would otherwise be dissipated as waste heat.

20 Claims, 8 Drawing Sheets

(56) References Cited

U.S. PATENT DOCUMENTS

2010/0066450 A1 3/2010 Palmer et al.
2011/0019760 A1 1/2011 Nguyen

OTHER PUBLICATIONS

Knight et al., "Self-Terminating Low-Voltage Swing CMOS Output Driver," IEEE Journal of Solid-State Circuits, vol. 23, No. 2, Apr. 1988. 8 pages.

Knight et al., "Self-Terminating Low Voltage Swing CMOS Output Driver," 1987 Custom Integrated Circuits Conference, Revised May 14, 1987. 4 pages.

PCT International Preliminary Report on Patentability dated Jan. 23, 2014 (Chapter I) in International Application No. PCT/US2012/041864. 8 pages.

Zolfaghari et al., "A Low-Power 2.4-GHz Transmitter/Receiver CMOS IC," IEEE Journal of Solid-State Circuits, vol. 38, No. 2, Feb. 2003, pp. 176-183. 8 pages.

\* cited by examiner

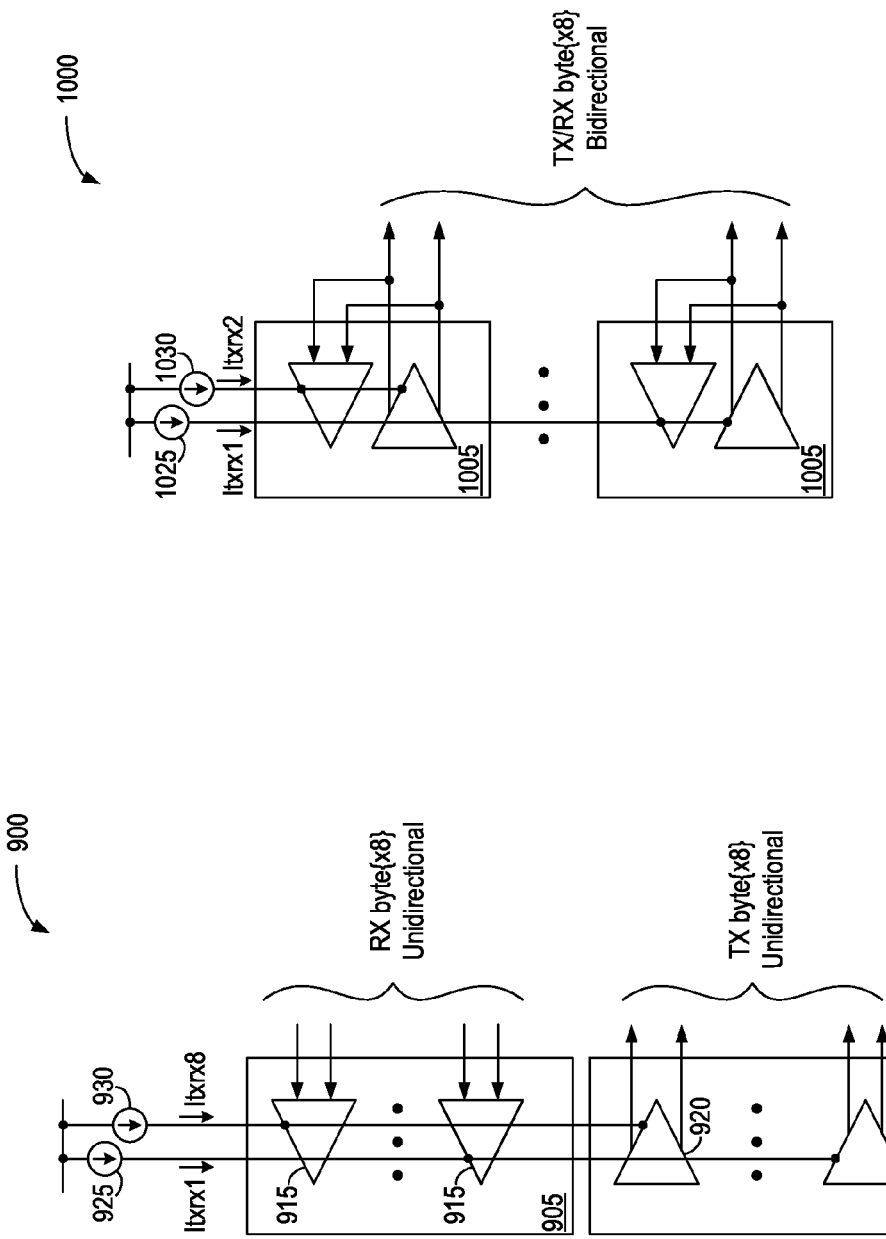

US 9,035,677 B2

HIGH-SPEED LOW POWER STACKED TRANSCEIVER

FIELD

The subject matter disclosed herein relates generally to the field of communications, and more particularly to high-speed electronic signaling within and between integrated circuit devices.

BACKGROUND

Present-day computing systems include high-speed channels, or links, to communicate information between integrated circuit (IC) devices. Such channels often achieve speed performance at the expense of power efficiency. Many systems would benefit from channels that require less power to move information at high data rates. For example, laptop computers quickly drain bulky, expensive batteries, and power dissipated as heat can be uncomfortable and often necessitates noisy fans and/or complex power-management schemes. Perhaps more important, power requirements and the batteries needed to meet them have considerable adverse impacts on the size, cost, usage time, and performance of handheld devices. There is therefore a demand for systems and methods for communicating at high speeds using minimal power.

BRIEF DESCRIPTION OF THE DRAWINGS

The subject matter disclosed is illustrated by way of example, and not by way of limitation, in the figures of the accompanying drawings and in which like reference numerals refer to similar elements and in which:

FIG. 4 details an IC 400 in accordance with one embodiment. IC 400 is in many ways similar to transmitter IC 305 of FIG. 3, with like-labeled elements being the same or similar.

FIG. 9 illustrates a stacked, full-duplex transceiver 900 in accordance with another embodiment.

FIG. 10 illustrates a stacked, half-duplex transceiver 1000 in accordance with another embodiment.

DETAILED DESCRIPTION

Figure 1B:
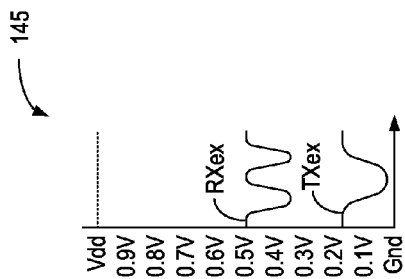
FIG. 1B is a waveform diagram 145 illustrating exemplary signaling ranges for an embodiment of system 100 in which Vdd is about 1.0 volts and the impedance through transmitter 130 is controlled such that node Vtxo is held at about 200 mV.
Figure 1A:
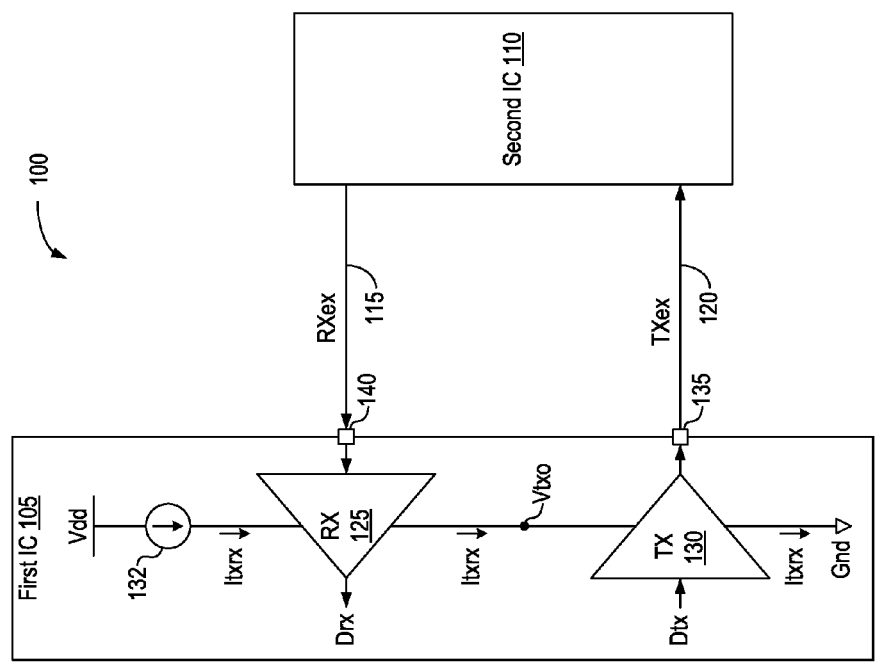
FIG. 1A depicts a system 100 in which integrated circuits (ICs) 105 and 110 communicate with one another via a pair of channels 115 and 120.

FIG. 1A depicts a system 100 in which integrated circuits (ICs) 105 and 110 communicate with one another via a pair of channels 115 and 120. IC 105 includes a receiver 125 and a transmitter 130 connected in series with a current source 132 to pass a current Itxrx between two power-supply nodes Vdd and Gnd. Powering both receiver 125 and transmitter 130 with the same supply current Itxrx saves power. The supply impedance through transmitter 130 can be controlled such that the voltage on a shared node Vtxo remains constant. In effect, transmitter 130 behaves as a resistive load for receiver 125. Transmitter 130 thus performs useful work with power that would otherwise be dissipated as waste heat.

Transmitter 130 includes a transmitter output node coupled to an external data node 135, where "external" refers to the fact that node 135 provides access to a channel external to IC 105. Transmitter 130 transmits an external signal TXex expressing first information derived from an internal signal Dtx to IC 110. In the reverse direction, receiver 125 includes an input node coupled to a second external data node 140 to recover a signal Drx from an external signal RXex expressing second information transmitted from IC 110. Signals referred to as "external" to an IC device enter or exit the IC device to communicate with another IC device in the same or a different IC package. IC devices within the same package can be interconnected using various two- and three-dimensional packaging schemes. In an embodiment in which first and second ICs 105 and 110 respectively include are a memory controller and memory array, the first and second information can be write and read data, respectively.

FIG. 1B is a waveform diagram 145 illustrating exemplary signaling ranges for an embodiment of system 100 in which Vdd is about 1.0 volts and the impedance through transmitter 130 is controlled such that node Vtxo is held at about 200 mV. External signal TXex exhibits a voltage swing of about 160 mV, from about 20 mV to about 180 mV. External signal RXex exhibits a similar voltage swing, but is offset to cover a range of voltages that exceeds the 200 mV potential of node Vtxo.

Figure 2:
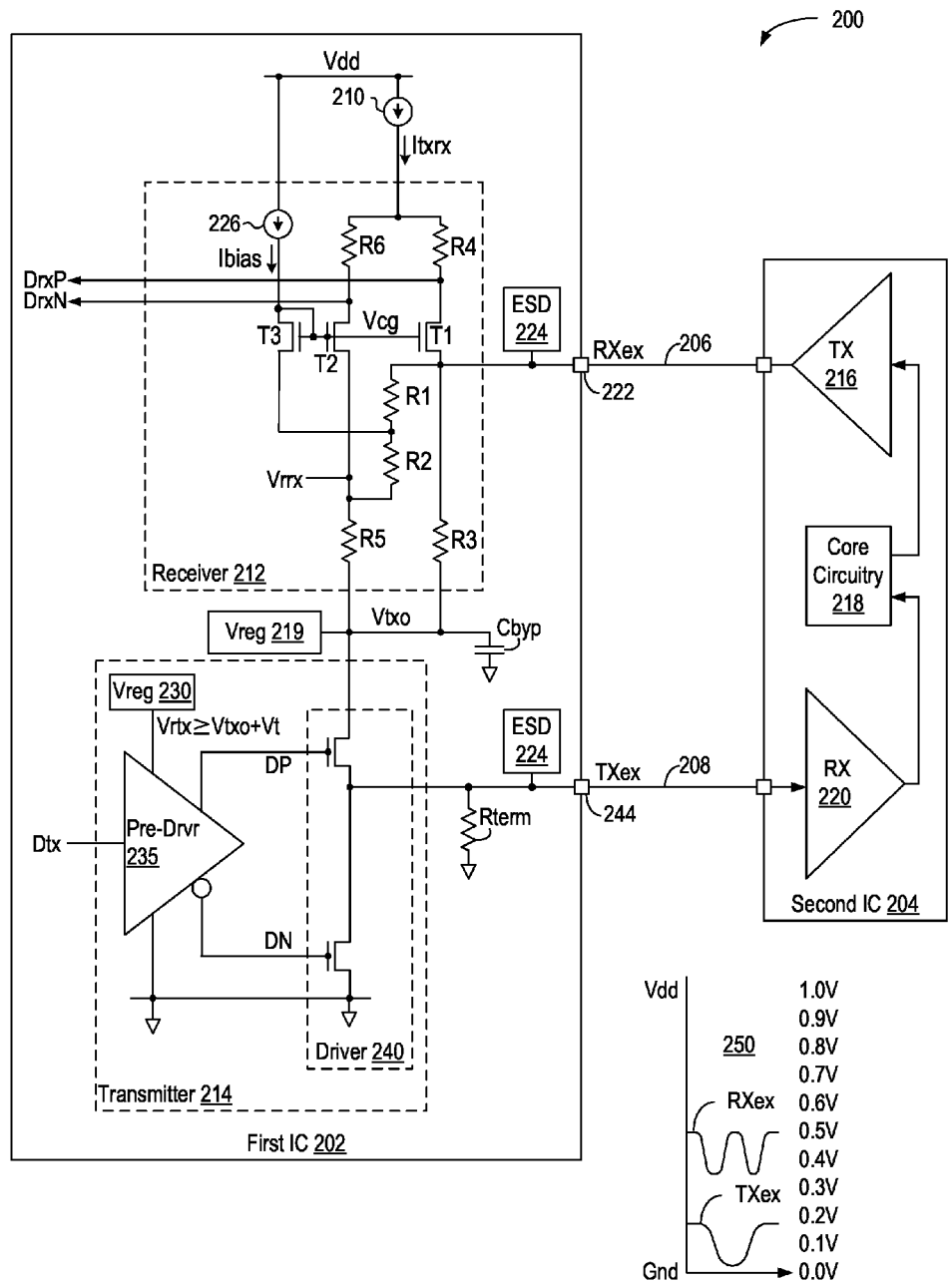
FIG. 2 depicts a communication system 200 in accordance with another embodiment.

FIG. 2 depicts a communication system 200 in accordance with another embodiment. System 200 includes first and second ICs 202 and 204 interconnected by a pair of single-ended communication channels 206 and 208. First IC 202 includes a current source 210, a receiver 212, and a transmitter 214. Second IC 204 includes a transmitter 216 that conveys signals RXex from some core circuitry 218 to receiver 212, and a receiver 220 that conveys signals TXex from transmitter 214 to core circuitry 218. Core circuitry 218 can be any circuitry that communicates information to and from second IC 204 (e.g., memory or controller circuitry).

Receiver 212 and transmitter 214 are coupled in series between supply nodes Vdd and Gnd, and both pass the same supply current Itxrx provided by current source 210. Furthermore, both receiver 212 and transmitter 214 have very low specific-power requirements, and can thus be used to advantage in applications that require both power efficiency and speed performance. The impedance through transmitter 214 is controlled such that the node Vtxo between transmitter 214 and receiver 212 remains at a constant voltage of e.g. 200 mV in an embodiment in which Vdd is 1.0V. A voltage regulator 219 is included to regulate node Vtxo to the desired voltage.

A bypass capacitor Cbyp from node Vtxo to e.g. ground or the common-mode voltage of signal TXex can also be included to reduce supply fluctuations. Balances or relatively balanced signaling schemes, such as data-bus inversion, can also be used to reduce data-dependent fluctuations on node Vtxo.

Signal RXex arrives at receiver 212 via a pad 222 and a path that is coupled to an electrostatic-discharge (ESD) protection device 224, the latter of which protects receiver 212 from damage due to electrostatic discharge. Signal RXex drives a common-gate amplifier that amplifies signal RXex with respect to a voltage reference Vrrx to provide gain and level conversion.

A voltage divider having two equivalent resistors R1 and R2 (e.g., 75 ohms each) extends between the input and reference nodes of receiver 212. A first nMOS transistor T1 has its source coupled to pad 222 and, via a resistor R3, to node Vtxo (a virtual ground); its drain is tied to current source 210 via a resistor R4; and its gate tied to a bias voltage Vcg (for "voltage common-gate"). A second nMOS transistor T2 has its source coupled to reference voltage Vrrx and, via a resistor R5, to node Vtxo; its drain tied to current source 210 via a resistor R6; and its gate tied to bias voltage Vcg. A third nMOS transistor T3 has its source coupled to the common-tap between resistors R1 and R2; its drain coupled to a current source 226 that delivers a bias current Ibias; and its gate tied to both its drain and to bias voltage Vcg. In this example, bias current Ibias is selected such that the gate-source voltage Vgs3 of transistor T3 sets voltage Vcg to a level that biases the source voltages Vs1 and Vs2 of transistors T1 and T2 to the common mode of signal RXex.

Transmitter 214 includes a voltage regulator 230, a complementary pre-driver 235, and a differential nMOS driver 240. The output from driver 240 is coupled to a pad 244 and includes an ESD protection device 224 and a termination resistor Rterm. Driver 240 is powered by the same supply current Itxrx as receiver 212.

Pre-driver 235 splits incoming data stream Dtx into complementary bit streams DP/DN to the gates of the nMOS transistors within output driver 240. When signal DP is high and DN low, the upper and lower nMOS transistors are turned on and off, respectively. In that case, current Itxrx flows from power node Vtxo through driver 240. Conversely, when signal DP is low and DN high, the upper and lower nMOS transistors are turned off and on, respectively. In that case, current flows from power node Vtxo to voltage regulator 219. The power efficiency of this signaling scheme is evident in the fact that much of the current between supply nodes Vtxo and ground is used both to receive information from and convey signals to receiver 220.

Pre-driver 235 is powered by regulator 230 and ground potential, so the signals DP/DN applied to the nMOS gates in driver 240 alternate between regulated voltage Vrtx and ground. Regulator 230 adjusts voltage Vrtx to set the sum of the pull-up and pull-down impedances of driver 240 approximately equal to the impedance of channel 208. The relative sizes of the pull-up and pull-down transistors may be fixed at design time to give equal impedance at an assumed operating point.

In one embodiment voltage Vrtx is tuned such that transmitter 214 exhibits an output impedance of about 100 ohms, and current Itxrx is tuned such that the voltage across transmitter 214 is about 200 mV. There are a number of methods and circuits for controlling voltage Vrtx and current Itxrx to obtain desired impedances and output swings, some of which are discussed below. In other embodiments the impedance through the output driver is digitally adjustable. For example, each transistor in driver 240 could be implemented as a collection of parallel, binary-weighted or thermometer-coded transistors that can be selectively enabled for impedance calibration. These and other methods and circuits for impedance calibration are well known to those of skill in the art.

The transistors within output driver 240 double as termination impedances. As such, the "on" impedance of each transistor should be matched to the channel and should behave linearly (like a resistor) over the range of output voltages. To accomplish this, each transistor is biased to remain in the "linear" region (aka the "triode" region) when conducting. When a transistor is in the linear region the current through the transistor changes linearly with changes in drain-source voltage Vds: in other words, the transistor behaves like a resistor.

As is well known, a transistor is in the linear region when its gate/source voltage Vgs is greater than the threshold voltage Vt of the transistor (Vgs>Vt) and its drain-source voltage Vds is less than or equal to Vgs−Vt. Stated mathematically, a transistor is in the linear region when:

$$Vgs > Vt \ \& \ Vds \leq Vgs - Vt \quad (1)$$

In FIG. 2, output driver 240 is referenced to ground, or zero volts. The voltage Vgs for a given transistor is therefore either zero volts (transistor off) or Vrtx (transistor on), and Vds is at most 0.75×Vtxo. We can ignore the case where a transistor is off because the impedance of a transistor biased off is very large relative to the impedance of the transistor biased on. Equation (1) therefore simplifies to:

$$0.75 * Vtxo \leq Vrtx - Vt. \quad (2)$$

which can be rearranged to derive the voltage Vrtx that keeps the transistors of output driver 240 in the triode region when active:

$$Vrtx \geq 0.75 * Vtxo + Vt \quad (3)$$

The transistors in driver 240 are selected such that regulator 230 can provide a voltage Vrtx that produces a desired output impedance over the expected range of output-voltage swings. The voltage Vt in equations 1 through 3 relates to the transistors within driver 240, and is assumed to be the same or similar for each nMOS transistor in this example. A waveform diagram 250 inset over channel 115 in FIG. 2 shows external signals TXex and RXex in an embodiment in which Vdd is 1.0V. Signals RXex and TXex transition over non-overlapping voltage ranges of about 200 mV.

Figure 3:
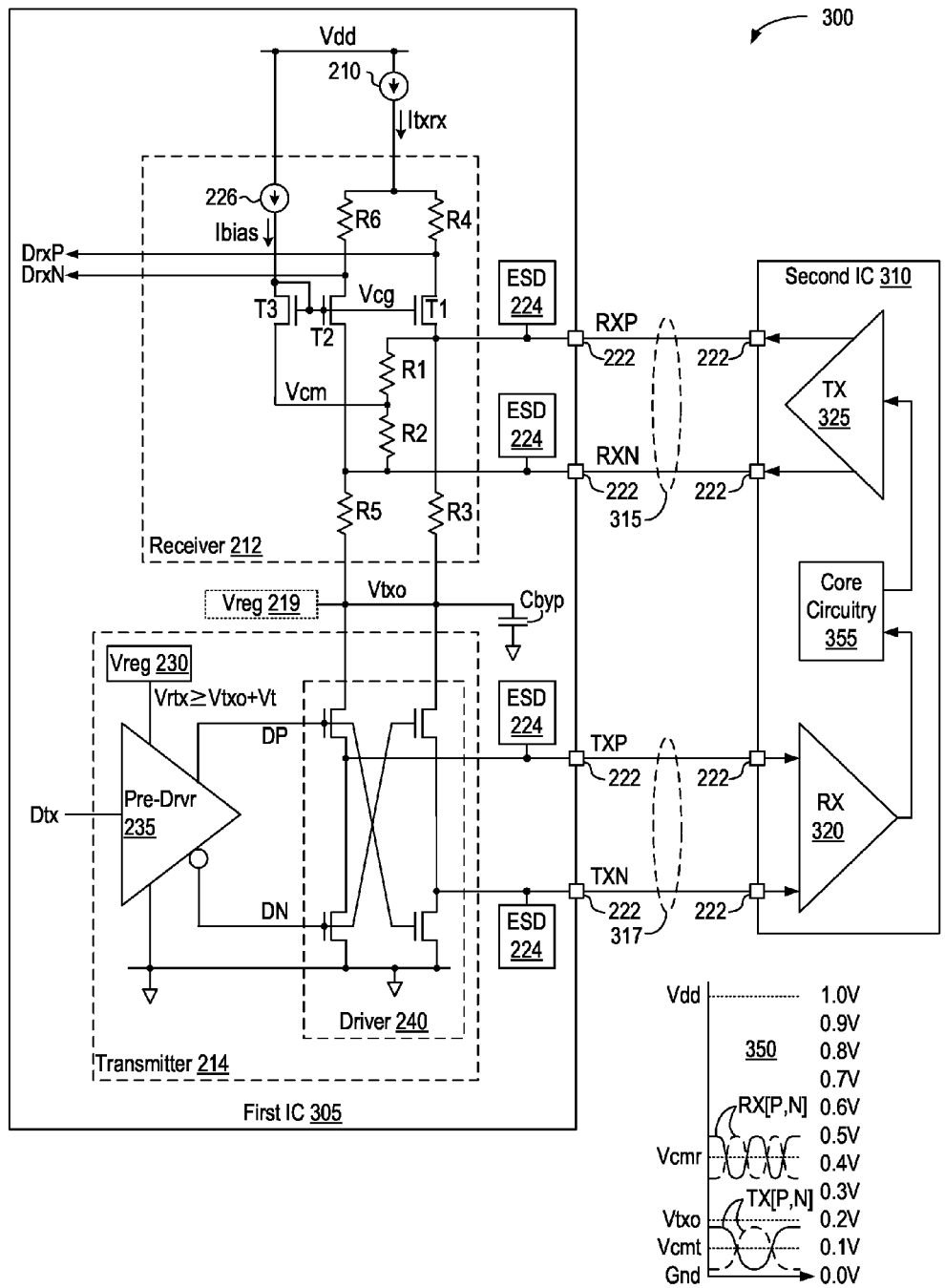
FIG. 3 depicts a differential, low-voltage system 300 in accordance with another embodiment.

FIG. 3 depicts a differential, low-voltage system 300 in accordance with another embodiment. System 300 is in some ways similar to system 200 of FIG. 2, with like-identified elements being the same or similar. The main distinction between system 200 and system 300 is that system 300 communicates differential external signals RXP/N and TXP/N rather than single-ended signals RXex and TXex. Other embodiments can use a mixture of single-ended and differential signals, and can be adapted to support either type of signaling in either or both directions.

System 300 includes first and second ICs 305 and 310 interconnected by differential communication channels 315 and 317. In IC 305, transmitter 214 is coupled to both conductors of channel 317 to deliver a low-voltage differential signal to a corresponding differential receiver 320 within IC 310. In one embodiment receiver 320 is identical to receiver 212, but is referenced to ground rather than to voltage Vtxo. Receiver 320 amplifies the differential signal while providing excellent common-mode noise rejection. Both transmitter 214 and receiver 320 have very low specific-power requirements, and can thus be used to advantage in applications that require both power efficiency and speed performance.

IC 310 also includes a transmitter 325 that conveys differential signal RX[P/N] to receiver 212. An ESD protection device 224 coupled to each pad 222 protects these differential input nodes and the input devices of receiver 212 from damage due to electrostatic discharge. In this example, the inputs of receiver 212 are terminated for the differential mode only, and about 25% of the termination impedance is represented by the receiver's input impedance.

Resistors R1 and R2 (e.g., 75 ohms each) extend in series between input nodes RXP and RXN. The node common to resistors R1 and R2 is a tap from which receiver 212, a differential amplifier, extracts the common-mode voltage Vcm of the incoming signal. This common-gate amplifier configuration works well for relatively low input voltages, and the bias scheme provided by current source 226 and transistor T3 affords considerable common-mode rejection without compromising the amplifier bandwidth.

Common-mode voltage fluctuations appear on the sources of transistors T1 and T2, and at the common-mode-voltage tap Vcm between resistors R1 and R2. The gate-source voltage Vgs3 of transistor T3 depends upon the value of bias current Ibias. Because bias current Ibias is constant, so too is voltage Vgs3. Common-gate voltage Vcg is the sum of Vcm and Vcg3, so common-gate voltage Vcg rises and falls with voltage Vcm. Common-mode-voltage fluctuations thus appear on both the sources and the gates of transistors T1 and T2. As a consequence, the gate-source voltages Vgs1 and Vgs2 of input transistors T1 and T2 remain constant in the face of common-mode noise. It follows that the currents through resistors R4 and R6 and respective output voltages DinP and DinN also remain constant. Receiver 212 thus provides effective common-mode noise rejection. Further, the common-mode rejection circuitry, which includes current source 226 and transistor T3 in this embodiment, is outside of the differential signal paths between the sources of respective transistors T1 and T2 and their respective pads 222. Transistor T3 is diode-connected in this embodiment, and functions to convert bias current Ibias into a stable gate-source voltage Vgs3. Transistor T3 might be replaced with e.g. a diode or resistor in other embodiments.

In some embodiments the source voltages Vs1 and Vs2 of transistors T1 and T2, the inputs of receiver 212, are biased to the nominal common-mode voltage Vcm for signal RX[P/N]. Such biasing is achieved by controlling bias current Ibias to set the voltage Vcg to a level that biases the source voltages Vs1 and Vs2 of transistors T1 and T2 to the desired nominal common-mode voltage. In this example, voltage Vcm is between four- and five-hundred millivolts.

Transmitter 214 is as detailed above in connection with FIG. 2, but differential outputs are provided to a corresponding pair of signal pads 222. When signal DP is high and DN low, the upper left and lower right nMOS transistors are turned on. In that case, current flows from power node Vtxo to ground via channel 317 and receiver 320. Conversely, when signal DP is low and DN high, the upper right and lower left nMOS transistors are turned on. Once again, current flows from power node Vtxo to ground via channel 317 and receiver 320, albeit in the opposite direction through receiver 320. The power efficiency of this signaling scheme is evident in the fact that substantially all the current between supply nodes Vtxo and ground is used to convey signals to receiver 320, and this current Itxrx is the same supply current employed by receiver 212 to amplify signal RX[P/N].

The differential impedance looking into output terminals of transmitter 214 is fairly independent of the common-mode voltage Vcmt of signal TX[P/N] because the pull-up transistor is operating as a source follower while the pull-down transistor is common-source. As common-mode voltage Vcmt increases, the pull-down's small-signal impedance increases, while the pull-up's small-signal impedance decreases.

To provide high-quality termination, the capacitance shunting the termination should be small. In both transmitter 214 and receiver 212, shunt capacitance is generally dominated by wiring and ESD protection devices 224. Regulator 230 regulates voltage Vrtx such that the nMOS transistors of output driver 240, when biased on, exhibit a desired resistance and remain in the triode region. In one embodiment, the desired on-resistance for the nMOS transistors is about fifty ohms.

In a typical example, assume it is desired that transmitter 214 convey a differential signal TX[P,N] having an output swing voltage of about 200 mVppd and exhibiting a differential output impedance of 100 ohms Regulator 230 and current Itxrx may be set such that output voltage Vtxo is about 200 mV. As in the example of FIG. 2, voltage regulator 219 can be included to maintain the desired voltage Vtxo, and signaling schemes such as data-bus inversion can be used to reduce data-dependent voltage fluctuations.

The output swing of each half of the differential output driver 240 is equal to half of output voltage Vtxo, centered at a common-mode voltage equal to half voltage Vtxo. There are a number of methods and circuits for controlling Vrtx to obtain a desired impedance, some of which are discussed below. The transistors within output driver 240 double as termination impedances in the manner detailed above in connection with FIG. 2. A waveform diagram 350 inset in FIG. 3 shows external signals RX[P,N] and TX[P,N] in accordance with one embodiment.

Second IC 310 includes some core circuitry 355 (e.g., memory and related address and control circuitry) that communicates with corresponding core circuitry (not shown) in IC 305 via channels 315 and 317. In some embodiments core circuitry 355 can forward information from receiver 320 to transmitter 325 in support of e.g. loop-back test and calibration procedures.

Transmitter 214 and receiver 212 are both implemented using NMOS transistors, which are well suited for low-voltage operation when configured as shown. However, other types of n- and p-type transistors might also be used. For example, transistors T1, T2, and T3 might be implemented using n-type bipolar junction transistors (BJTs). A BJT configured like transistor T1 would be in a common-base configuration, the current-handling terminals would be called the collector and emitter instead of the drain and source, and the BJT control terminal would be called the base instead of the gate.

Figure 4:
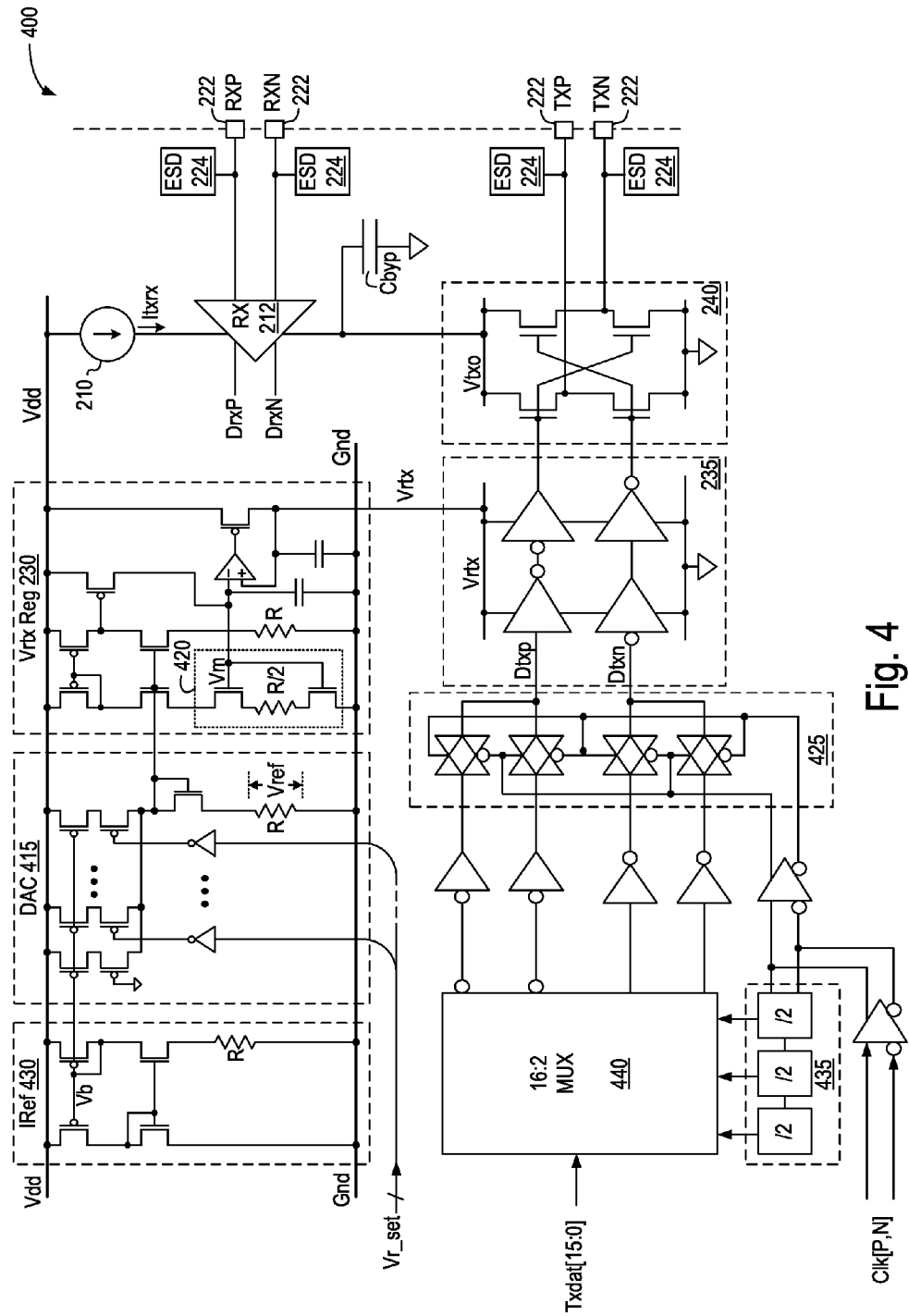

FIG. 4 details an IC 400 in accordance with one embodiment. IC 400 is in many ways similar to transmitter IC 305 of FIG. 3, with like-labeled elements being the same or similar. Output terminals TX[P,N] are driven by output driver 240 operating between ground GND and a voltage Vtxo, which is controlled by calibrating the impedance through driver 240 and the current through source 210 as noted previously. Predriver 235, operating between ground GND and regulated voltage Vrtx, drives the gates of the nMOS transistors in driver 240. Regulated voltage Vrtx determines the output impedance of output driver 240 and is generated by an on-chip regulator 230 in this embodiment. Voltage Vrtx is adjusted digitally responsive to a calibration signal Vr_set to a DAC 415. Signal Vr_set can be generated externally or internally, and can be stored in e.g. an internal register (not shown).

The paired inverters in pre-driver 235 ensure that transition times for both data-edge polarities will be equal. Pre-driver 235 provides fanout, which allows a 2:1 multiplexer 425 at the input of pre-driver 235 to be drawn quite small, thereby minimizing the load on a half-bit-rate distributed clock Clk [P,N]. Since pre-driver 235 is powered from a regulated supply, it is fairly immune to power supply noise and introduces very little timing jitter. The variation of regulated voltage Vrtx across cases tends to make the edge rate of the gate control signals driving the output stage nearly constant across PVT variation, and the edge rate of the transmitter output is also nearly constant.

The differential impedance looking into the transmitter output terminals (e.g., nodes TX[P,N]) is fairly independent of the common-mode voltage of signal TX[P,N] because the active pull-up transistor is configured as a source follower while the active pull-down transistor is in a common-source configuration. As the common-mode voltage increases, the pull-down transistor's small-signal impedance increases, while the pull-up transistor's impedance decreases. During a data transition, the output impedance depends on the details of the trajectories of the drive voltages at the gates of the output transistors.

Capacitance Cbyp, optionally in conjunction with voltage regulator 219, rejects noise and contributes to the termination impedance. Line currents into terminals TX[P,N] flow through the pull-up/pull-down impedances in series with receiver 212 and current source 210. Capacitance Cbyp, about 36 pF in one example, may be implemented in the 2.5-V "native" nMOS device and occupy about 8400 um$^2$. Capacitance Cbyp can be implemented as a thick-oxide device for improved reliability, but this capacitor is charged to less than 300 mV in this embodiment, so the oxide is not heavily stressed in any case. Use of the 1-V native device would have provided 2.5 the capacitance in the same area.

Regulator 230 is a two-stage design in this example. The first stage generates a "master" copy Vm of the Vrtx control voltage. Since the load current for the pMOS stage is near zero, it is easy to make the output pole for this two-pole regulator the dominant one, and power-supply rejection is quite good. The second stage is a simple series regulator with a gain of one, and it serves to isolate the "master" voltage Vm from the time-varying load of the transmitter's pre-driver inverters. The transmitter replica 420 used to set the impedance is drawn very small (1/16th scale); mismatches between the replica devices and the main transmitter contributes about a 5% variation in output impedance.

All of the P+/poly de-salicided resistors are digitally trimmable by ±20% to account for process variation. Trim is performed using a bench measurement in some embodiments; a production transceiver may use e.g. a resistor trim cell and an external reference resistor. In systems with a number of transmitters, regulator 230, DAC 415, and current reference 430 may be shared among the transmitters.

At the lower left of FIG. 4, a half-bit-rate distributed clock Clk[P,N] is received and buffered in CMOS inverter stages to drive the final 2:1 multiplexer (mux) 425 and a clock divider stage 435 that generates one-quarter, one-eighth, and one-sixteenth-rate clocks for a 16:2 mux stage 440 that serializes data Txdat[15:0].

Figure 5:
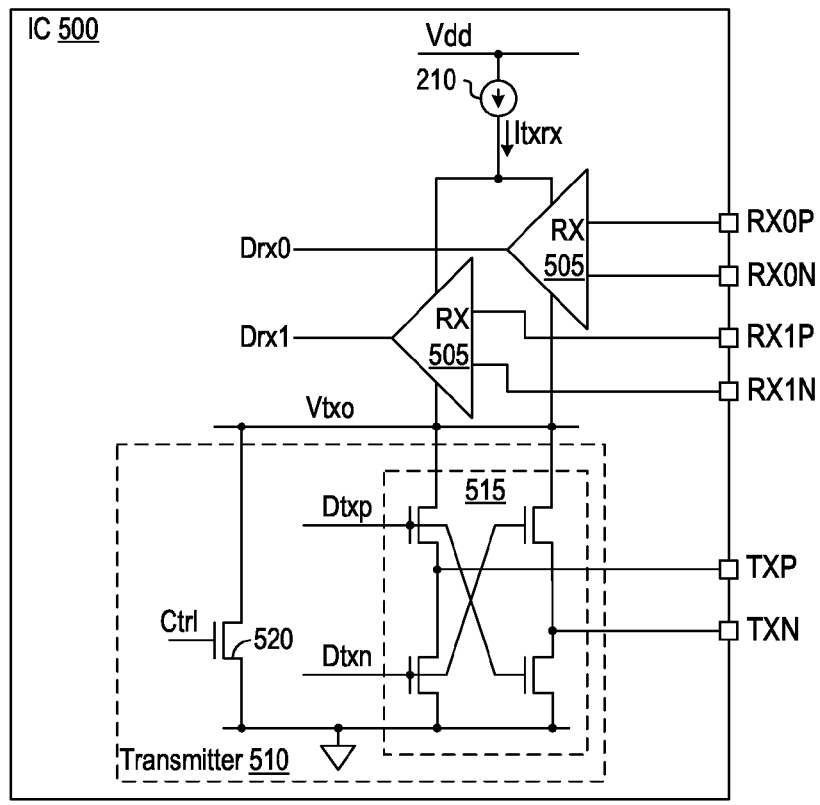
FIG. 5 depicts an IC 500 in accordance with another embodiment. IC 500 includes three communication circuits that share the same supply current Itxrx, a pair of receivers 505 and a transmitter 510.

FIG. 5 depicts an IC 500 in accordance with another embodiment. IC 500 includes three communication circuits that share the same supply current Itxrx, a pair of receivers 505 and a transmitter 510. Transmitter 510 includes a driver 515 through which the impedance is controlled in the manner described previously in connection with driver 240. Transmitter 510 additionally includes a shunt 520 that can be enabled using a control signal CTRL when driver 515 is tri-stated to maintain voltage Vtxo at a desired level (e.g., 200 mV). Shunt 520 is a transistor in this example, the impedance through which can be calibrated by application of a suitable control voltage. In other embodiments the shunt is e.g. a digitally adjustable impedance.

Receivers 505 split current Itxrx between them (e.g., in equal shares) to amplify a pair of received external signals RX0[P,N] and RX1[P,N], and thus produce a corresponding pair of internal signals Drx0 and Drx1. Receivers 505 are collectively a two-bit receiver that is coupled in series with transmitter 510 and current source 210 to form a path between power-supply nodes Vdd and Gnd. Other embodiments may include one or more additional drivers in parallel with driver 515. Powering receivers 505 and driver 515 with the same supply current Itxrx saves power when IC 500 is simultaneously transmitting and receiving signals.

Figure 6:
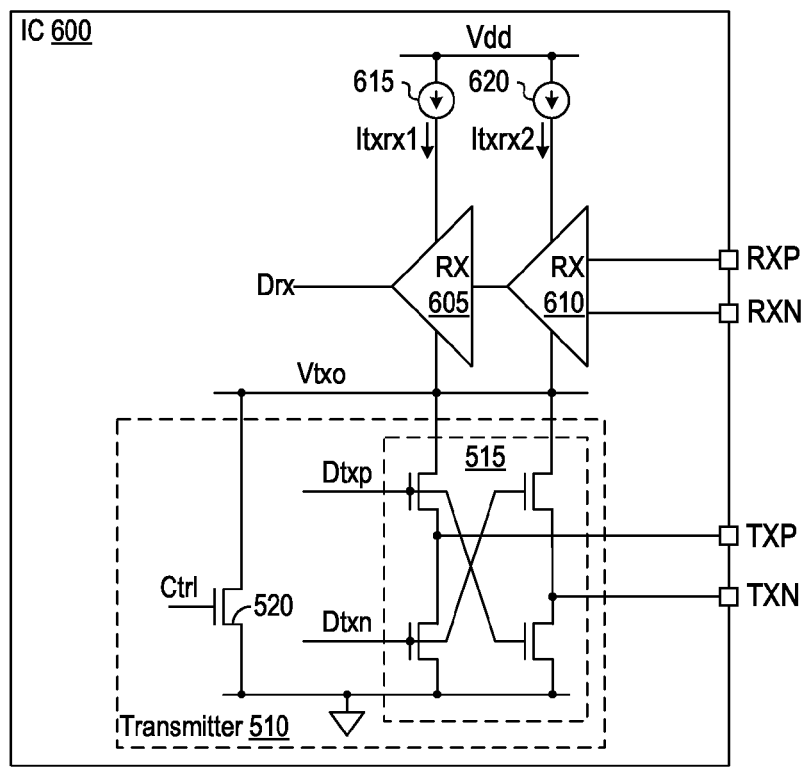
FIG. 6 depicts an IC 600 in accordance with another embodiment.

FIG. 6 depicts an IC 600 in accordance with another embodiment. IC 600 includes three communication circuits, a pair of receivers 605/610 and a transmitter 510 of the type discussed in connection with FIG. 5. Each receiver is powered by a respective supply current Itxrx1/Itxrx2 from a corresponding current source 615/620. The supply currents are combined at node Vtxo and conducted through driver 515. Receivers 605/610 provide multiple stages of amplification for an external signal RX[P,N], and thus produce a corresponding internal signal Drx. Supply current Itxrx1/Itxrx2 may be calibrated separately, together, or both.

Figure 7:
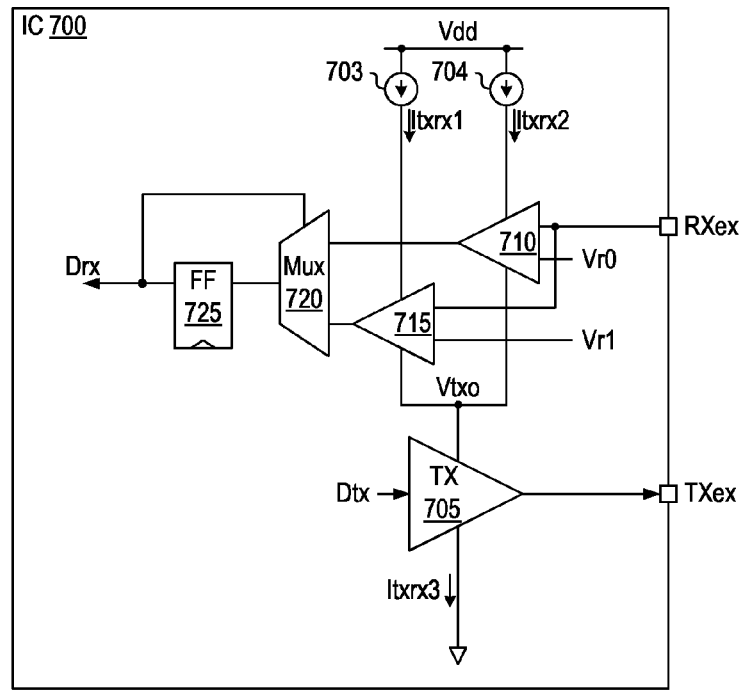
FIG. 7 depicts an IC 700 in accordance with another embodiment.

FIG. 7 depicts an IC 700 in accordance with another embodiment. IC 700 includes a pair of current sources 703/704, a transmitter 705, a pair of receivers 710/715, a multiplexer 720, and a flip-flop 725. The receivers, multiplexer, and flip-flop collectively represent a decision feedback equalizer (DFE), a type of nonlinear equalizer that considers previously resolved samples in resolving current symbols to reduce or eliminate the effects of inter-symbol interference (ISI) on the current symbols. Receivers 710/715 compare the same external signal RXex to respective reference voltages Vr0 and Vr1 and provide their outputs to multiplexer 720. Multiplexer 720 selects an output from one of receivers 710/715 based on the value of the prior symbol captured in flip-flop 725. The currents Itxrx1 and Itxrx2 through respective receivers 710/715 can be controlled separately, collectively, or both. The sum of currents Itxrx1 and Itxrx2 powers transmitter 705 as current Itxrx3.

Figure 8:
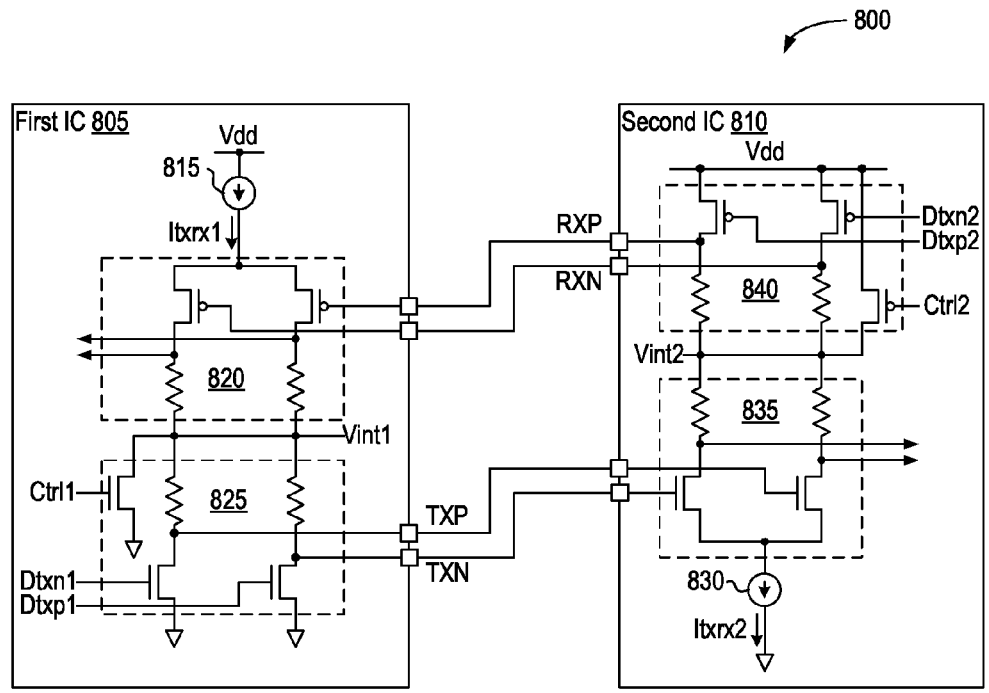
FIG. 8 depicts a system 800 in accordance with an embodiment in which each of first and second ICs 805 and 810 supports a respective stacked transceiver.

FIG. 8 depicts a system 800 in accordance with an embodiment in which each of first and second ICs 805 and 810 supports a respective stacked transceiver. First IC 805 includes a current source 815, a receiver 820, and a transmitter 825 that each pass the same supply current Itxrx1. Receiver 820 and transmitter 825 steer the same supply current Itxrx1, receiver 820 to amplify signal RX[P,N] and transmitter 825 an internal signal Dtx[n1/p1]. Second IC 810 similarly includes a current source 830, a receiver 835, and a transmitter 840 that pass a supply current Itxrx2. Receiver 835 and transmitter 840 steer the same supply current Itxrx2 to amplify respective signals Dtx[n2/p2] and TX[P,N].

The transmitters and receivers are all differential in this example, and each transmitter includes a shunt controlled by a respective control signal Ctrl1 or Ctrl2 to provide desired impedances when the transmitters are tri-stated. Each stacked transmitter/receiver pair is separated by an intermediate voltage node Vint1 or Vin2, which may be set to different voltages in the respective transceivers. In one embodiment supply voltage Vdd is about one Volt and both Vint1 and Vint2 are calibrated to about one-half Volt. Similar stacked transceivers can be implemented using all NMOS or PMOS devices on either or both ICs.

FIG. 9 illustrates a stacked, full-duplex transceiver 900 in accordance with another embodiment. Transceiver 900 includes a byte-wide receiver 905 and a byte-wide transmitter 910. Receiver 905 includes eight differential receivers 915, and transmitter 910 eight differential transmitters 920. A first current source 925 supplies current Itxrx1 to one of receivers 915 and one of transmitters 910. A second current source 930 likewise supplies current Itxrx2 to another receiver/transmitter pair. The remaining receiver/transmitter pairs and their associated current sources are omitted from FIG. 9 for ease of illustration. A low-impedance line of e.g. metal can pass an identical current to a number of communication circuits with little voltage drop or power loss.

FIG. 10 illustrates a stacked, half-duplex transceiver 1000 in accordance with another embodiment. Transceiver 1000 includes eight one-bit transceivers 1005, each of which includes a transmitter/receiver pair. A first current source 1025 supplies current Itxrx1 to the lowermost one of transceivers 1005, and a second current source 1030 supplies current Itxrx2 to the uppermost transceiver. The remaining transceivers and their associated current sources are omitted from FIG. 10 for ease of illustration. In other embodiments multiple transceivers can share the same supply current.

Figure 11:
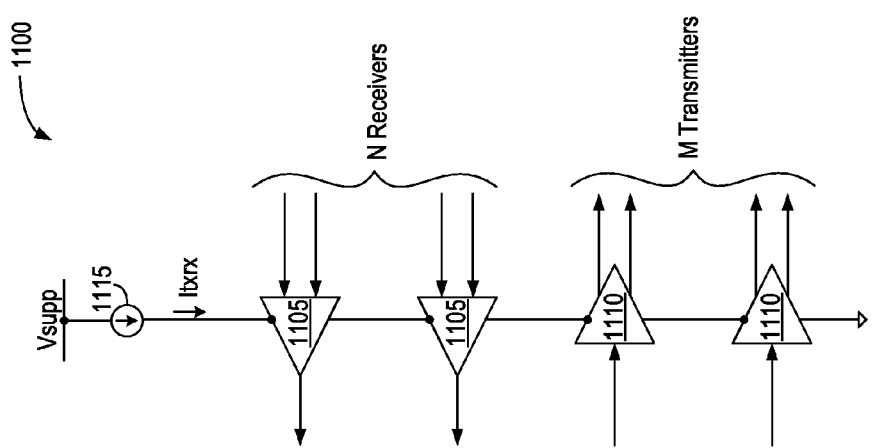
FIG. 11 illustrates a stacked multi-channel transceiver 1100 in accordance with an embodiment in which N receivers 1105 and M transmitters 1110 share the same supply current Itxrx from a current source 1115.

FIG. 11 illustrates a stacked multi-channel transceiver 1100 in accordance with an embodiment in which N receivers 1105 and M transmitters 1110 share the same supply current Itxrx from a current source 1115. Both N and M are at least one, and the supply voltage between Vsupp and ground potential provide sufficient head room for the total number of transmitters and receivers (N+M).

Figure 12:
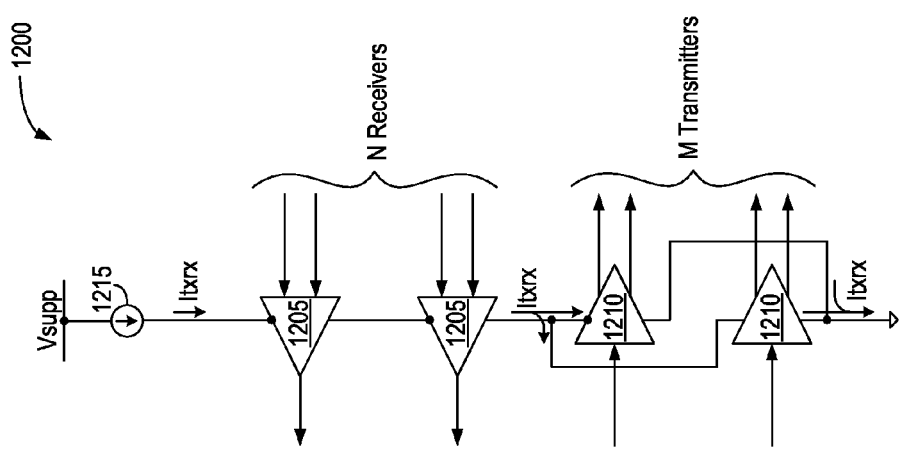
FIG. 12 illustrates a stacked multi-channel transceiver 1200 in accordance with another embodiment in which N receivers 1205 and M transmitters 1210 share the same supply current Itxrx from a current source 1215.

FIG. 12 illustrates a stacked multi-channel transceiver 1200 in accordance with another embodiment in which N receivers 1205 and M transmitters 1210 share the same supply current Itxrx from a current source 1215. Transmitters 1210 are connected in parallel between receivers 1205 and ground so that supply current Itxrx is split between them. The value of M is at least two in this example.

The above-described transmitters and receivers are designed to operate at a single speed, but could be modified to operate over a range of speeds. Providing communication channels that work over a wide range of data rates typically requires more power consumption, however. Whether fixed or adjustable, the frequency of operation can be chosen to best utilize the process technology used to fabricate the devices.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments.

An output of a process for designing an IC device, or a portion of an IC device, comprising one or more of the circuits described herein may be a computer-readable medium such as, for example, a magnetic tape or an optical or magnetic disk. The computer-readable medium may be encoded with data structures or other information describing circuitry that may be physically instantiated as an IC device or portion of an IC device. Although various formats may be used for such encoding, these data structures are commonly written in Caltech Intermediate Format (CIF), Calma GDS II Stream Format (GDSII), or Electronic Design Interchange Format (EDIF). Those of skill in the art of IC design can develop such data structures from schematic diagrams of the type detailed above and the corresponding descriptions and encode the data structures on computer readable medium. Those of skill in the art of IC fabrication can use such encoded data to fabricate IC devices comprising one or more of the circuits described herein.

While the present invention has been described in connection with specific embodiments, variations of these embodiments will be obvious to those of ordinary skill in the art. For example, the above-described links can be bidirectional, as would be required e.g. for memory systems, and might operate with a non-terminated receiver in channels with little crosstalk and reflections. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. An integrated circuit (IC) device comprising:
first and second external data nodes;
first and second supply nodes to provide respective first and second supply voltages;
a transmitter having a transmitter output node coupled to the first external data node to transmit a first external signal; and
a receiver having a receiver input node coupled to the second external data node to receive a second external signal;
wherein the transmitter and receiver form a series current path between the first and second supply nodes.

2. The IC device of claim 1, further comprising a current source coupled in series with the transmitter and the receiver between the first and second supply nodes.

3. The IC device of claim 1, wherein the transmitter exhibits an impedance in the current path, the IC device further comprising a regulator coupled to the transmitter to control the impedance.

4. The IC device of claim 3, wherein the transmitter comprises a transistor driver, and wherein the regulator controls a gate voltage of the transistor driver.

5. The IC device of claim 1, wherein the receiver is one of a plurality of receivers forming parallel current paths between the first supply node and the transmitter.

6. The IC device of claim 1, wherein the receiver is one of a plurality of receivers coupled in series between the supply node and the transmitter to form the series current path.

7. The integrated circuit of claim 1, wherein the first external signal transitions over a first voltage range, and the second external signal transitions over a second voltage range that is separate than the first voltage range.

8. The IC device of claim 1, further comprising a shunt disposed in parallel with the transmitter to selectively form an alternative series current path between the first and second supply nodes.

9. A method for communicating transmitted and received signals to and from an IC device having a supply current that is common to each of a transmitter and a receiver, the method comprising:
    steering the supply current through the transmitter to develop the transmitted signal; and
    steering the supply current through the receiver in response to the received signal.

10. The method of claim 9, wherein the transmitter exhibits an impedance to the supply current, the method further comprising regulating the impedance to maintain a voltage between the transmitter and the receiver.

11. The method of claim 9, further comprising maintaining the supply current constant.

12. The method of claim 9, wherein the receiver is one of a plurality of receivers forming parallel current paths for the supply current.

13. The method of claim 9, wherein the transmitted signal transitions over a first voltage range, and the received signal transitions over a second voltage range that does not overlap the first voltage range.

14. An integrated circuit (IC) device comprising:
    first and second supply nodes to provide respective first and second supply voltages;
    a transmitter having a transmitter output node to transmit a first signal expressing first information using a current between the first and second supply nodes; and
    a receiver having a receiver input node to receive a second signal, expressing second information, using the current.

15. The IC device of claim 14, further comprising a second receiver to receive a third signal, expressing third information, using the current.

16. The IC device of claim 15, wherein each of the first-mentioned and second receivers use all of the current.

17. The IC device of claim 15, wherein each of the first and second receivers use a portion of the current.

18. The IC device of claim 14, further comprising a second transmitter to transmit a third signal, expressing third information, using the current.

19. The IC device of claim 18, wherein each of the first-mentioned and second transmitters use all of the current.

20. The IC device of claim 18, wherein each of the first-mentioned and second transmitters use a portion of the current.

* * * * *